United States Patent
Wen et al.

(10) Patent No.: US 9,093,602 B2
(45) Date of Patent: Jul. 28, 2015

(54) SEMICONDUCTOR LIGHT EMITTING DEVICE

(71) Applicant: HUGA OPTOTECH INC., Taichung (TW)

(72) Inventors: Wei-Chih Wen, Hsinchu (TW);
Shiou-Yi Kuo, Kaohsiung (TW);
Tai-Chun Wang, Changhua County (TW)

(73) Assignee: HUGA OPTOTECH INC., Taichung (TW)

( * ) Notice: Subject to any disclaimer, the term of this patent is extended or adjusted under 35 U.S.C. 154(b) by 122 days.

(21) Appl. No.: 13/662,565

(22) Filed: Oct. 29, 2012

(65) Prior Publication Data
US 2013/0105846 A1     May 2, 2013

(30) Foreign Application Priority Data
Oct. 27, 2011   (TW) .............................. 100139041 A (51) Int. Cl.
| | |
|---|---|
| *H01L 33/00* | (2010.01) |
| *H01L 33/20* | (2010.01) |
| H01L 33/60 | (2010.01) |
| H01L 33/24 | (2010.01) |
| H01L 33/62 | (2010.01) |

(52) U.S. Cl.
CPC ................ *H01L 33/20* (2013.01); *H01L 33/24* (2013.01); *H01L 33/60* (2013.01); *H01L 33/62* (2013.01)

(58) Field of Classification Search
CPC . H01L 33/007; H01L 33/38; H01L 21/02458; H01L 33/10; H01L 33/02; H01L 33/24; H01L 33/002; H01L 33/40; H01L 33/20
USPC ................. 257/98, 99, 79, 95, 13, 103, 324; 438/33, 40, 27, 41, 43, 39, 343
See application file for complete search history.

(56) References Cited

U.S. PATENT DOCUMENTS

| | | | |
|---|---|---|---|
| 7,652,299 B2 | 1/2010 | Urashima | |
| 8,659,004 B2* | 2/2014 | Aihara et al. | 257/13 |
| 2005/0199885 A1* | 9/2005 | Hata et al. | 257/79 |
| 2005/0205890 A1* | 9/2005 | Uemura | 257/103 |
| 2006/0145171 A1* | 7/2006 | Nitta et al. | 257/95 |
| 2006/0192247 A1* | 8/2006 | Urashima et al. | 257/324 |
| 2009/0162959 A1* | 6/2009 | Hsu et al. | 438/33 |
| 2010/0019247 A1 | 1/2010 | Joichi et al. | |
| 2010/0059773 A1* | 3/2010 | Cheng et al. | 257/98 |
| 2010/0176418 A1* | 7/2010 | Muraki et al. | 257/103 |
| 2011/0001147 A1* | 1/2011 | Cheng et al. | 257/79 |

(Continued)

FOREIGN PATENT DOCUMENTS

| | | |
|---|---|---|
| KR | 100996451 | 11/2010 |
| TW | I342613 B | 10/2006 |

*Primary Examiner* — Mohammed Shamsuzzaman
(74) *Attorney, Agent, or Firm* — Muncy, Geissler, Olds & Lowe, P.C.

(57) ABSTRACT

A semiconductor light emitting device includes a substrate having a main surface and an exposed surface; an epitaxial structure, disposed on the main surface of the substrate, having at least a first type semiconductor layer, a light-emitting layer, and a second type semiconductor layer, wherein the first type layer has a first sidewall including at least a first etched surface and a second etched surface, wherein angles between the etched surfaces and the exposed surface are acute angles; and an electrode structure disposed on the epitaxial structure.

4 Claims, 9 Drawing Sheets

(56) References Cited

U.S. PATENT DOCUMENTS

| | | | |
|---|---|---|---|
| 2011/0012155 A1* | 1/2011 | Huang et al. | 257/98 |
| 2011/0193122 A1* | 8/2011 | Yuh | 257/98 |
| 2012/0122257 A1* | 5/2012 | Yashima et al. | 438/40 |
| 2012/0132951 A1* | 5/2012 | Son | 257/99 |
| 2012/0171791 A1* | 7/2012 | Tu et al. | 438/33 |
| 2013/0260490 A1* | 10/2013 | Shatalov et al. | 438/27 |
| 2013/0313597 A1* | 11/2013 | Dai et al. | 257/98 |

* cited by examiner

SEMICONDUCTOR LIGHT EMITTING DEVICE

CROSS-REFERENCE TO RELATED APPLICATION

This application claims the priority benefit of Taiwan application serial no. 100139041, filed Oct. 27, 2011. The entirety of the above-mentioned patent application is hereby incorporated by reference herein and made a part of this specification.

BACKGROUND OF THE INVENTION

1. Field of the Invention

The present application generally relates to the field of semiconductor light-emitting devices, and more particularly, to a semiconductor light-emitting device having several non-parallel etched surfaces.

2. Description of the Prior Art

A light-emitting diode (LED) is a solid-state semiconductor light source that is fabricated with semiconductor materials and capable of transforming electricity into light energy efficiently. LEDs are used in applications as diverse as: replacements for aviation lighting, automotive lighting (particularly for indicators), in traffic signal lights, billboards, the backlight of the display and so on. The compact size of LEDs has allowed new text and video displays or sensor devices to be developed, with their quick switching rates being very useful for advanced communication technology.

A structure of a conventional light-emitting device generally includes a substrate, an epitaxial structure disposed on the substrate, a p-side electrode pad electrically connected to a p-type semiconductor layer located in the epitaxial structure, an n-side electrode pad electrically connected to an n-type semiconductor layer located in the epitaxial structure, an active layer disposed between the p-type semiconductor layer and the n-type semiconductor layer. In addition, a transparent conductive layer (TCL) is usually disposed between the p-side electrode pad and the p-type semiconductor layer in order to create an ohmic contact.

A semiconductor light-emitting device, includes a substrate including a main surface and an exposed surface, wherein the main surface and the exposed surface include concavo-convex structures; an epitaxial structure disposed on the main surface of the substrate including a first type semiconductor layer, a light-emitting layer, a second type semiconductor layer, a buffer layer disposed between the first type semiconductor layer and a nucleation layer and the nucleation layer disposed between the substrate and the buffer layer; an electrode structure disposed on the epitaxial structure; wherein an upper part of the first type semiconductor layer includes a first sidewall including a first etched surface so that a first angle between the first etched surface and the exposed surface is acute; wherein a bottom part of the first type semiconductor layer, the buffer layer and the nucleation layer includes a second sidewall including a second etched surface so that a second angle between the second etched surface and the exposed surface is also acute, which is narrower than the first angle, wherein an angle inside the epitaxial structure between the first etched surface and the second etched surface is between 90° and 180°, wherein highest light intensity is usually at emission angles of 60° and 120° and the light intensity is gradually reduced toward emission angles of 0° and 180°.

SUMMARY OF THE INVENTION

According to one embodiment of the present application, a semiconductor light-emitting device is provided, which includes a substrate comprising a main surface and an exposed surface; an epitaxial structure disposed on the main surface of the substrate comprising at least a first type semiconductor layer, a light-emitting layer and a second type semiconductor layer, wherein the first type semiconductor layer has a first sidewall comprising at least a first etched surface and a second surface wherein the angles between the etched surfaces and the exposed surface are acute angles; and an electrode structure disposed on the epitaxial structure.

According to another embodiment of the present application, a semiconductor light-emitting device is provided, which comprises a substrate comprising a main surface and an exposed surface; and an epitaxial structure disposed on the main surface of the substrate comprising a sidewall, which comprises at least a first etched surface and a second etched surface with an acute angle between each of the etched surfaces and the exposed surface.

In still another embodiment, the present application provides a semiconductor light-emitting device comprising the following components: a substrate which comprises a main surface and an exposed surface; and an epitaxial structure which is disposed on the main surface of the substrate comprising at least a first type semiconductor layer, a light-emitting layer and a second type semiconductor layer, wherein the epitaxial structure has a first sidewall comprising at least a first etched surface and a second etched surface different and adjacent to the first etched surface; additionally, an angle between each of the etched surfaces and the exposed surface is less than 180° and larger than 0°.

BRIEF DESCRIPTION OF THE DRAWINGS

The accompanying drawings provide a further understanding of the invention, are incorporated in and constitute a part of this specification. The drawings illustrate embodiments of the invention and, together with the description, serve to explain the principles of the invention. In the drawings:

FIGS. 2-5 are schematic diagrams showing a method for fabricating a semiconductor light-emitting device according to embodiments of the application, wherein

It should be noted that all the figures are for representation only. Relative dimensions and proportions of parts of the drawings are exaggerated or reduced in size, for the sake of

DETAILED DESCRIPTION

Figure 1:
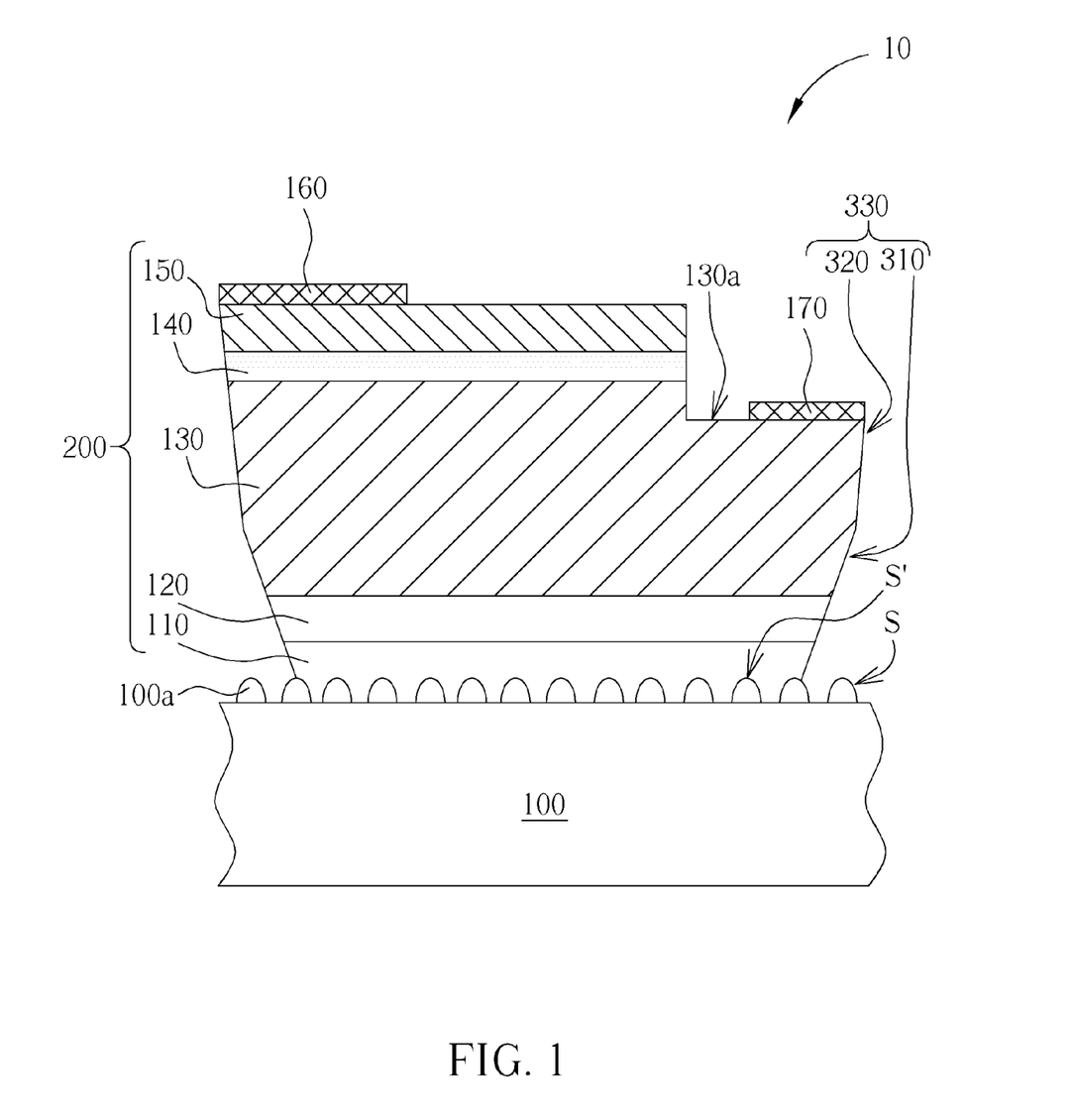
FIG. 1 is a schematic, cross-sectional diagram showing a semiconductor light-emitting device according to one embodiment of the application.

Please refer to FIG. 1, which is a cross-sectional diagram showing a semiconductor light-emitting device according to one embodiment of the application. As shown in FIG. 1, a semiconductor light-emitting device 10 includes the following components. A patterned substrate 100 includes concavo-convex structures 100a. An epitaxial structure 200 disposed on a main surface S' of the substrate 100 comprises a first type semiconductor layer 130, a light-emitting layer 140 and a second type semiconductor layer 150, wherein the first type semiconductor layer 130 has a top surface 130a and a first sidewall 330. The sidewall 330 includes a first etched surface 310 and a second etched surface 320, wherein angles between the etched surfaces 310, 320 and an exposed surface S exposed from the semiconductor light-emitting device 10 are acute. A first electrode 170 is disposed on the top surface 130a. A second electrode 160 is disposed on the second type semiconductor layer 150. In addition, there may be a nucleation layer 110 and a buffer layer 120 between the first type semiconductor layer 130 and the patterned substrate 100.

In the following description, numerous specific details are given to provide a thorough understanding of a fabricating method related to the application. It will, however, be apparent to those skilled in the art that the invention may be practiced without these specific details. Furthermore, some well-known system configurations and process steps are not disclosed in detail, as these should be well-known to those skilled in the art.

Likewise, the drawings showing the embodiments of the apparatus are not to scale and some dimensions are exaggerated for clarity of presentation. Also, when multiple embodiments are disclosed and described as having some features in common, like or similar features will usually be described with same reference numerals for ease of illustration and description thereof.

Figure 2:
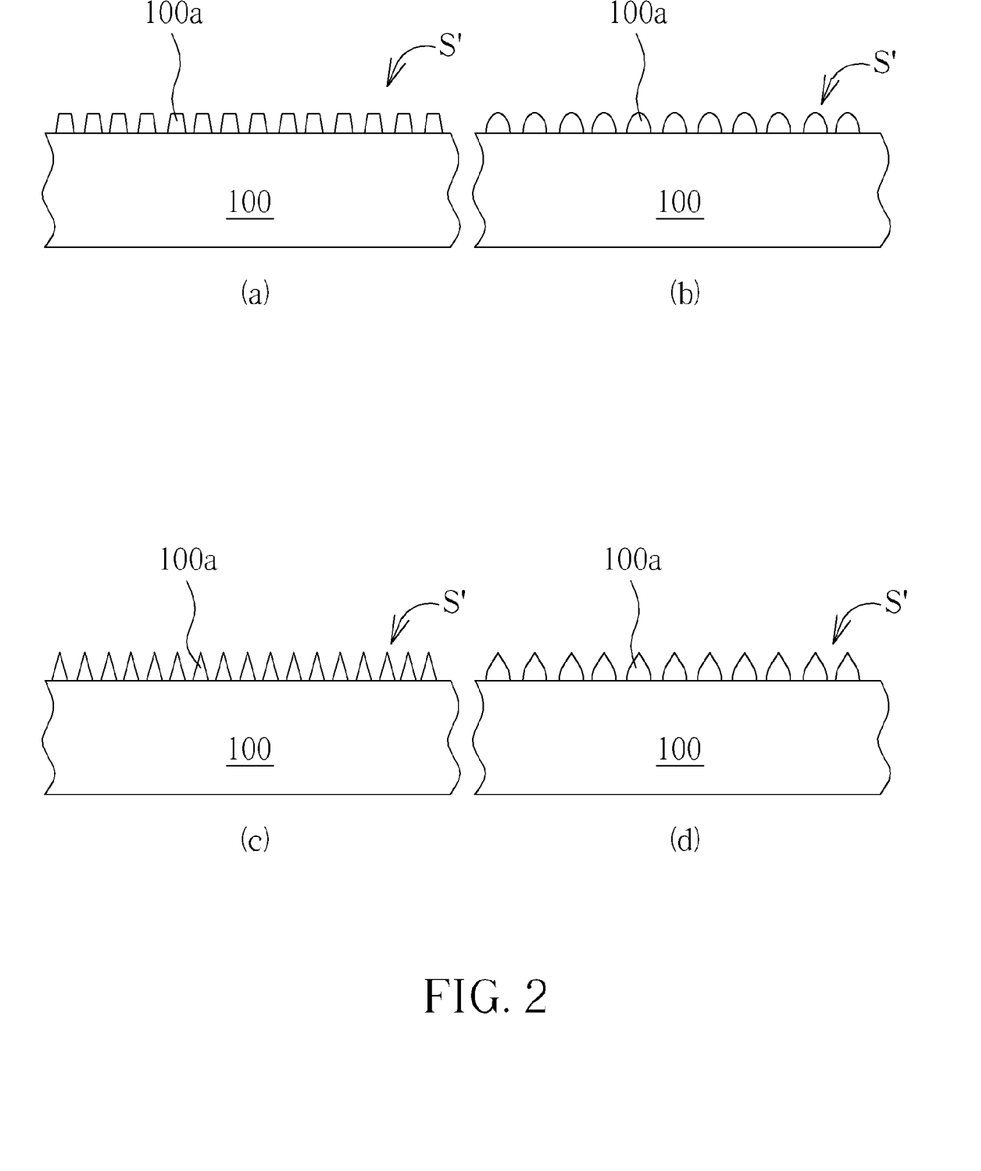
FIG. 2 is a schematic, cross-sectional view of a patterned substrate.
Figure 3:
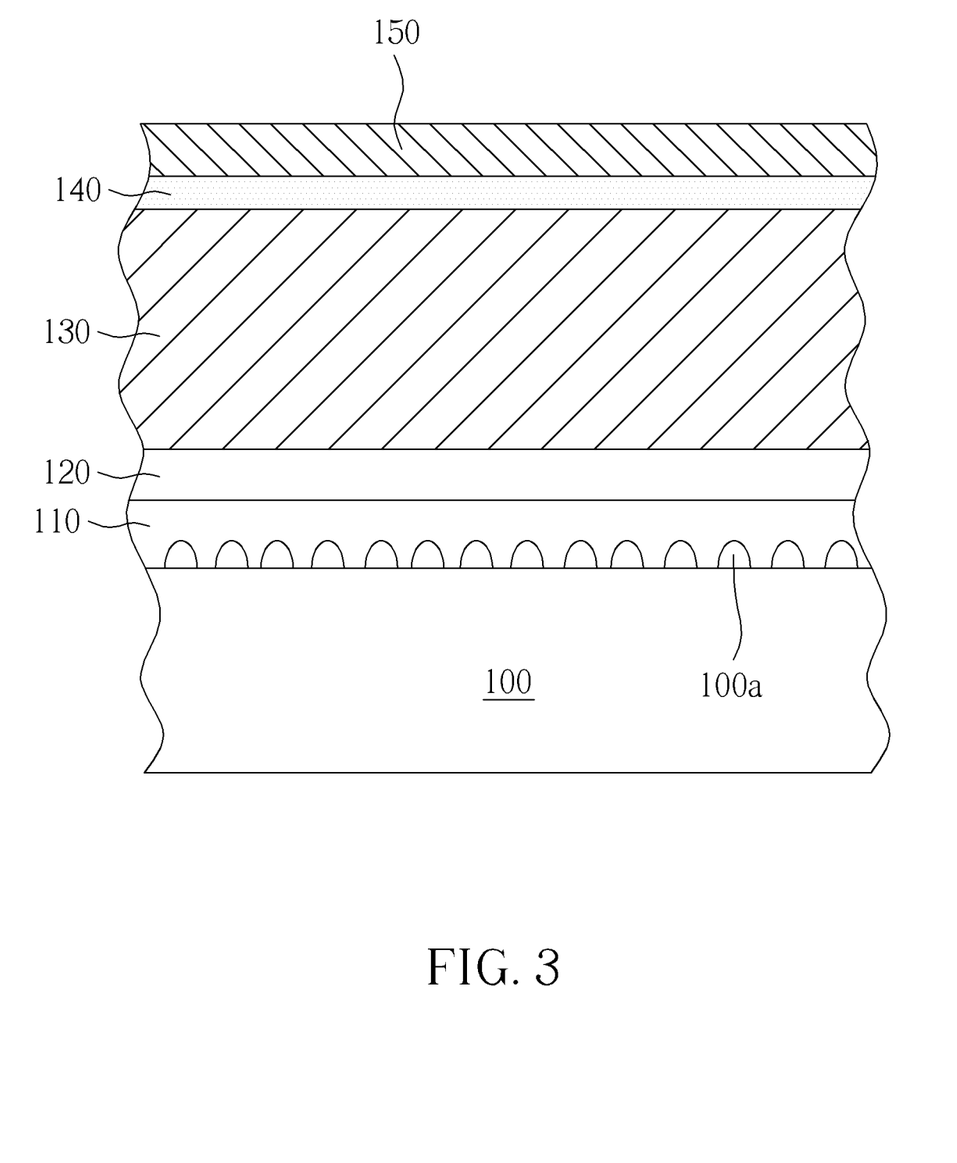
FIG. 3 is a schematic, cross-sectional diagram showing a structure after epitaxial growth processes.
Figure 4:
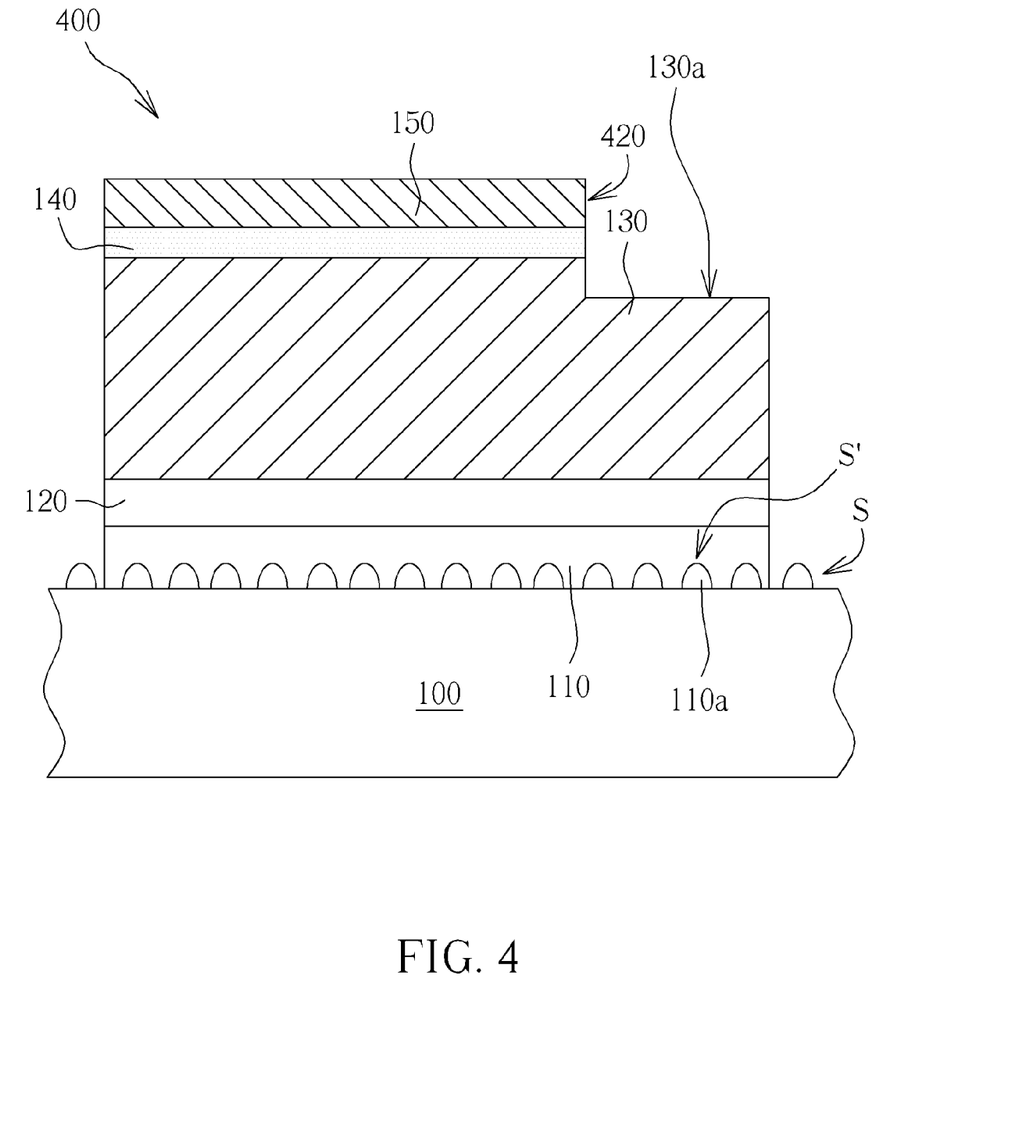
FIG. 4 is a schematic, cross-sectional diagram showing a structure after a dry-etching process and dicing.

FIGS. 2-4 are diagrams showing a method for fabricating a light-emitting device according to embodiments of the application. As shown in FIG. 2, FIG. 2 is a cross-sectional view of a patterned substrate. At the beginning of the processes, a patterned substrate 100, such as a patterned sapphire substrate (PSS), but not limited thereto, is provided. The patterned substrate 100 has a main surface S', wherein a main facet of the main surface S' may be selected from the groups consisting of C plane, R plane, A plane and M plane. According to this embodiment, C plane is preferable to be the main facet of the main surface S'. Concavo-convex structures 100a are then formed on the main surface S' by performing an etching method, such as mechanical polishing, plasma etching, wet etching or the like, concavo-convex, which may include triangular frustum structures, oval structures, tetrahedral structures or polygonal structures corresponding to (a)-(d) shown in FIG. 2, but is not limited thereto. The concavo-convex structures 100a can not only increase the light extraction efficiency of the semiconductor light-emitting device 10 but also provide a specific facet, like an R plane within the patterned substrate 100, to facilitate the growth of an epitaxial structure 200 along the specific facet.

Please refer to FIG. 3. FIG. 3 is a cross-sectional diagram showing a structure after an epitaxial growth process. The compositions of the epitaxial structure 200 are described as follows. A nucleation layer 110, a buffer layer 120, a first type semiconductor layer 130, a light-emitting layer 140 and a second type semiconductor layer 150 are formed sequentially by performing an epitaxial growth process. The nucleation layer 110 is a film being preferably 0.02 micrometer (μm) thick, but not limited thereto. The compositions of the nucleation layer 110 and the buffer layer 120 may include aluminum nitride (AlN), aluminum gallium nitride ($Al_xGa_{1-x}N$) or other nitride semiconductor material doped with aluminum, preferably to be AlN. According to this embodiment, the first type semiconductor layer 130 is an n-type semiconductor layer comprising a aluminum indium gallium nitride ($Al_xIn_yGa_{1-x-y}N$, $0 \leq x \leq 1$, $0 \leq y < 1$, $0 \leq x+y \leq 1$) doped with n-type dopants (such as silicon atoms or germanium atoms for example), while the second type semiconductor layer 150 is a p-type semiconductor layer comprising an aluminum indium gallium nitride ($Al_xIn_yGa_{1-x-y}N$, $0 \leq x \leq 1$, $0 \leq y < 1$, $0 \leq x+y \leq 1$) doped with p-type dopants (such as magnesium atoms). The light-emitting layer 140 has a multiple quantum well (MQW) comprising a multilayer structure of GaN/InGaN stacked alternately with each other. Since a fabrication processes for the MQW is well-known to those skilled in the art, it is therefore omitted herein for the purpose of brevity. In addition, the epitaxial growth process may include Metal Organic Chemical Vapor Deposition (MOCVD), Molecular Beam Epitaxy (MBE), Hydride Vapor Phase Epitaxy (HVPE) and so forth. For sake of the clarity, only necessary features are illustrated in the preceding embodiment; it should, however, not be construed in a limiting sense. For example, there could be other layers between the first type semiconductor layer 130 and the patterned substrate 100, such as a cladding layer, a reflective layer or a Distributed Bragg Reflector (DBR), but is not limited thereto.

Figure 5:
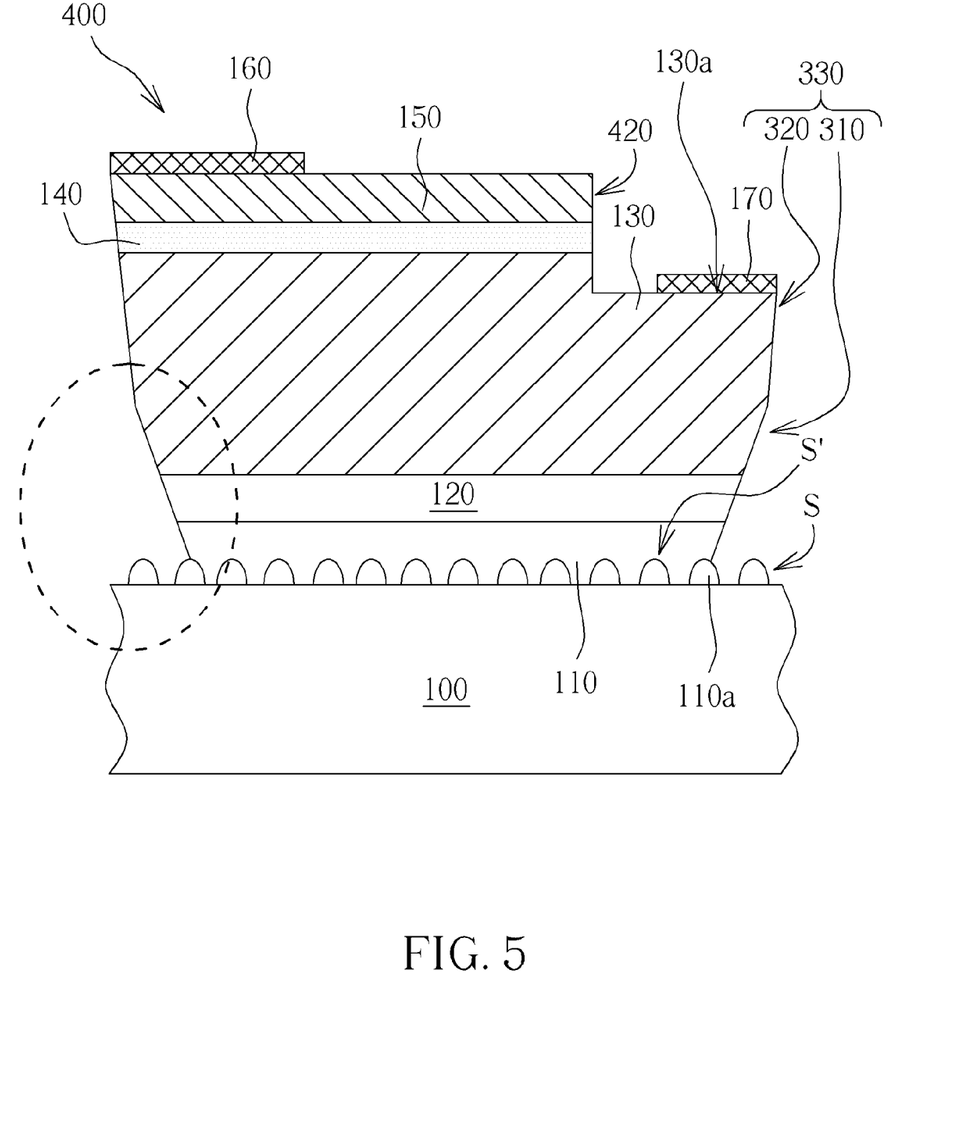
FIG. 5 is a schematic, cross-sectional diagram showing a semiconductor light-emitting device after a wet-etching process.

Please refer to FIGS. 4 and 5. FIG. 4 is a cross-sectional diagram showing a structure after a dry-etching process and a dicing process; FIG. 5 is a cross-sectional diagram showing a semiconductor light-emitting device after a wet-etching process. The detailed processes are described as follows. First, a mesa 400 and a region (not shown) are formed by performing at least a photolithography and etching process, each of them can respectively accommodate a second electrode 160, like a p-type electrode, and a first electrode 170, like an n-type electrode, on a top surface 130a of the first type semiconductor layer 130, wherein the mesa 400 has a second sidewall 420 approximately vertical to the main surface S'. The etching process described above is a dry-etching process, preferably an Inductively Coupled Plasma Reactive Ion Etching (ICP-RIE). Then, the dicing process is carried out to dig trenches (not shown) surrounding the semiconductor light-emitting device 10. The shape of the trenches may be any out of a U-shape, V-shape or the like, and the depth of the trenches may reach the main surface S' of the patterned substrate 100. Therefore, the trenches may be used to separate and electrically isolate each semiconductor light-emitting device 10. The dicing process may include carbon dioxide laser, Yttrium Aluminum Garnet Laser (YAG laser), excimer laser, pulsed laser and so on, but is not limited thereto.

Please refer to FIG. 5. By implementing a wet-etching process on the exposed surface S, parts of the sidewall (not shown) of the first type semiconductor layer 130 is etched away. Etchant in the wet-etching process comprises orthophosphoric acid, which can provide unequal etching rates on the different facets of the first type semiconductor layer 130, such as R plane, A plane or M plane. A first sidewall 330, which comprises a first etched surface 310 and a second etched surface 320, is formed, wherein angles between the etched surfaces 310, 320 and the exposed surface S are all acute. The first etched surface 310 is not parallel to the second surface 320 and these two etched surfaces 310, 320 may or may not be adjacent to each other. According to another embodiment, two etched surfaces of the first sidewall 330 may be not parallel to each other, while the etched surfaces are adjacent to each other and angles between each of the etched surfaces and the exposed surface S are all acute. According to still another embodiment, a first sidewall 330 may comprise two or more etched surfaces which are not parallel to each other, while the etched surfaces are adjacent to each other and angles between the etched surfaces and the exposed surface S are all obtuse. In short, according to various embodiments of the application, the common features are that each etched surface is not perpendicular to the exposed surface S. In addition, the wet-etching may etch away parts of the sidewalls (not shown) of the nucleation layer 110 and the buffer layer 120; therefore, the sidewalls may be parallel to the first etched surface 310. It should be noted that, after the formation of the first etched surface 310 and the second etched surface 320, there could be a plurality of reverse tapers or forward tapers (not shown) in the first type semiconductor layer 130.

Figure 6:
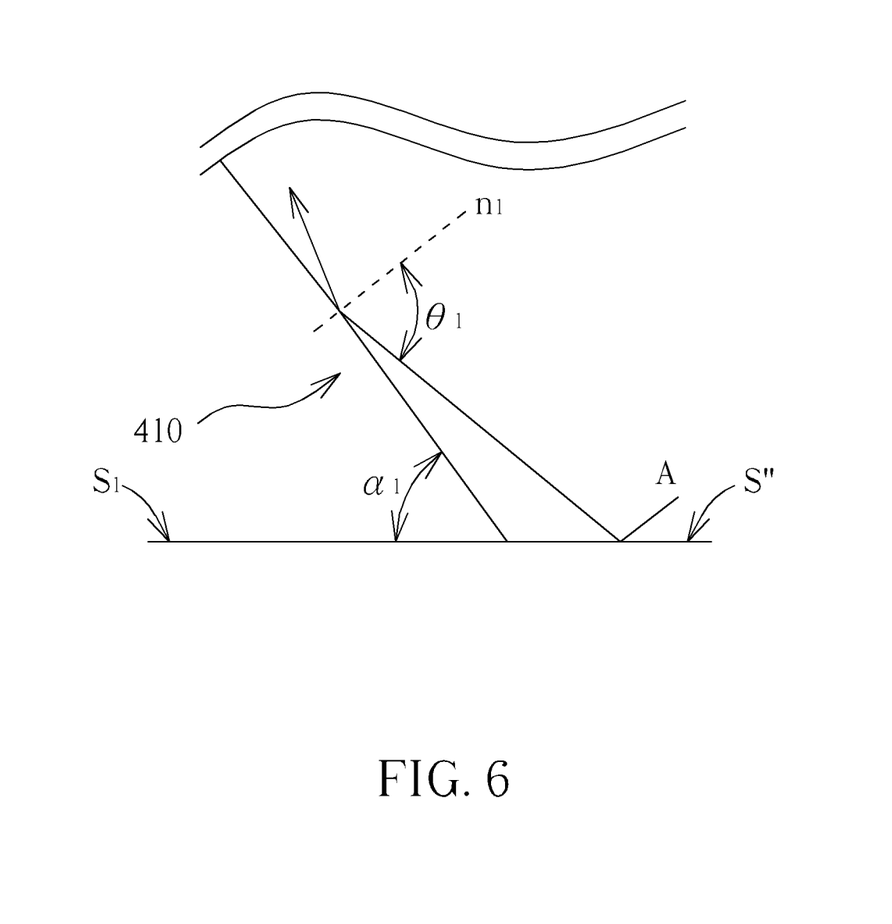
FIG. 6 is a schematic, enlarged diagram showing a partial structure of a conventional semiconductor light-emitting device.
Figure 7:
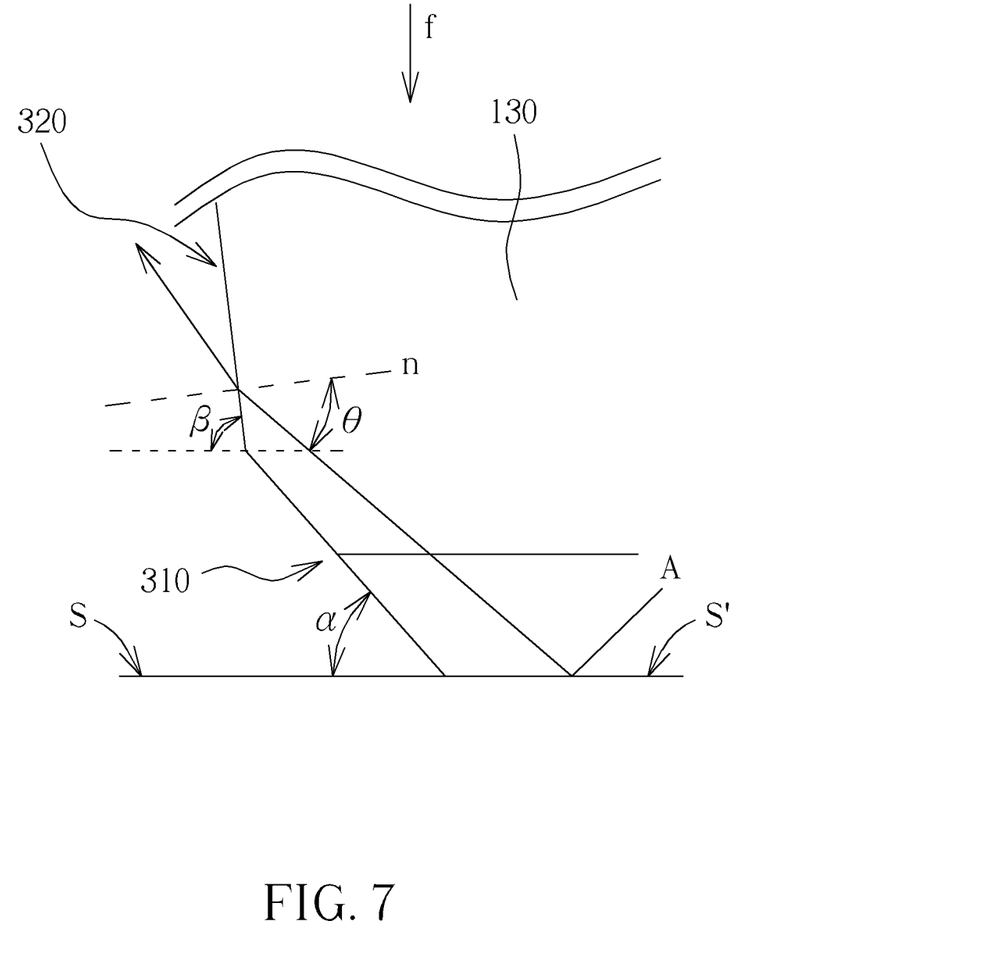
FIG. 7 is a schematic, cross-sectional diagram showing an enlarged picture of an encircled region in the FIG. 5.

Please refer to FIG. 6 and FIG. 7. FIG. 6 is an enlarged diagram showing a partial structure of a conventional semiconductor light-emitting device; FIG. 7 is a cross-sectional diagram showing an enlarged picture of an encircled region in the FIG. 5. As shown in FIG. 6, a semiconductor layer (not shown) has only one etched surface 410, where a first angle $\alpha_1$ between the etched surface 410 and the exposed surface $S_1$ is acute. Compared to a structure shown in FIG. 7, a first angle $\alpha$ between the first etched surface 310 and the exposed surface S is acute and a second angle $\beta$ between the second etched surface 320 and the exposed surface S is acute. An angle (not shown) inside the first type semiconductor layer 130 between the first etched surface 310 and the second etched surface 320 is in the rage of 90° to 180°. The To be more specific, the first acute angle $\alpha$ is approximately 58° and is narrower than the second acute angle $\beta$. The etched surfaces with different angles to the exposed surface may affect the path of light rays in the semiconductor layers and further affect the light distribution profile and light extraction efficiency of the semiconductor light-emitting devices. The cause of above-mentioned phenomenon is described as follows. Based on a conventional technique, as shown in FIG. 6, when a light ray A from the light-emitting layer (not shown) is reflected on the Main surface S", it would be directed to the etched surface 410. However, since an angle $\theta_1$ between the direction of the light ray A and a normal n is larger than the critical angle, a total reflection of the light ray A occurs once the light ray A impinge on the etched surface 410. Therefore, the light ray A can't penetrate an interface between air and the semiconductor layer effectively. According to one embodiment shown in FIG. 7, the first type semiconductor layer 130 further comprises the second etched surface 320. When the light ray A is reflected on the main surface S', it would be directed to the second etched surface 320. At this time, since an angle $\theta$ between the direction of the light A and a normal n is less than a critical angle, the light ray A penetrates the interface between air and the semiconductor layer effectively without the total reflection phenomenon. In addition, the first etched surface 310 may act as a total reflective surface to direct light rays to the second etched surface 320 or a front face; therefore, the intensity of the output optical power is enhanced.

Figure 8:
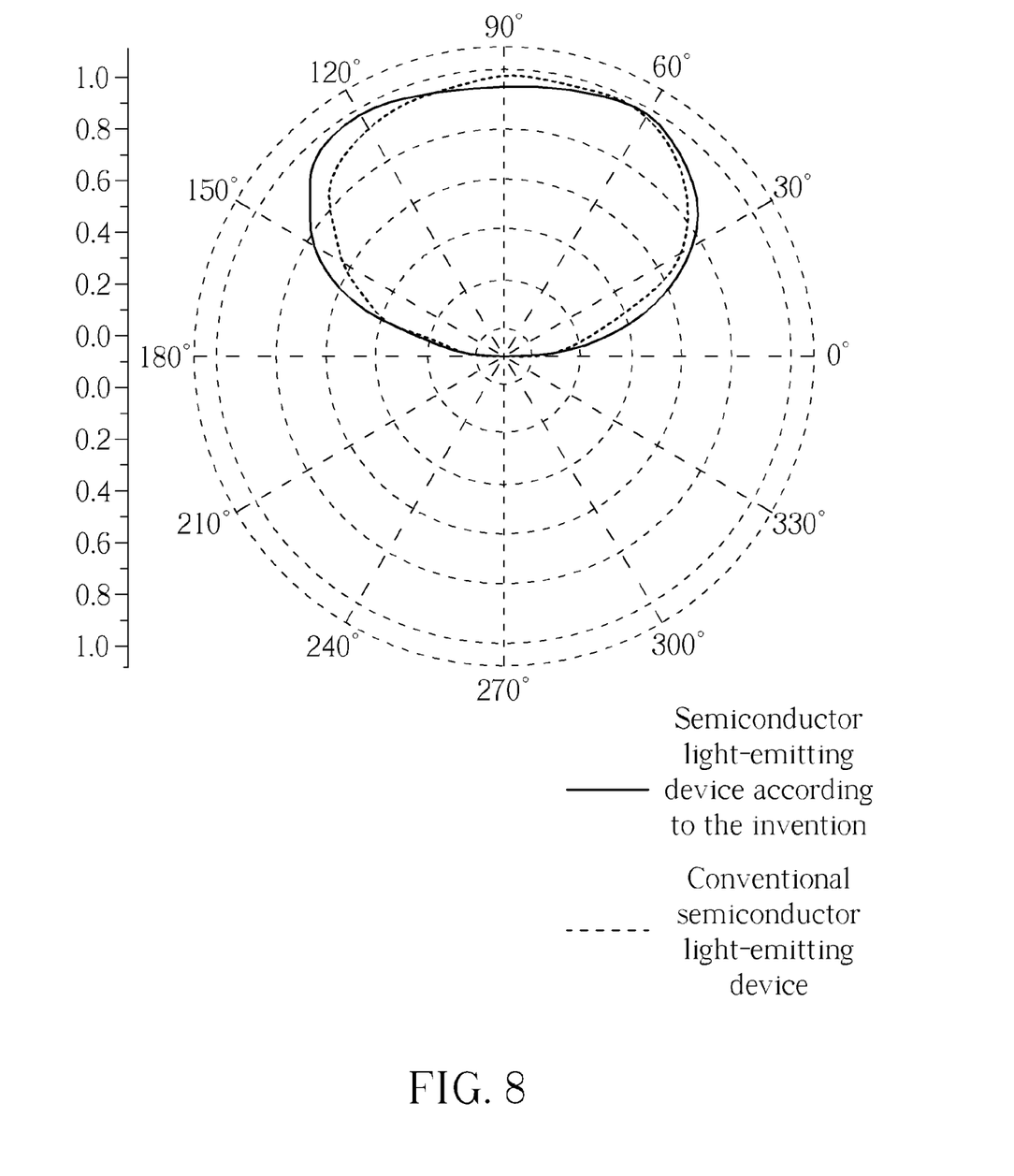
FIG. 8 is a light distribution curve demonstrating the performance of two different semiconductor light-emitting devices.
Figure 9:
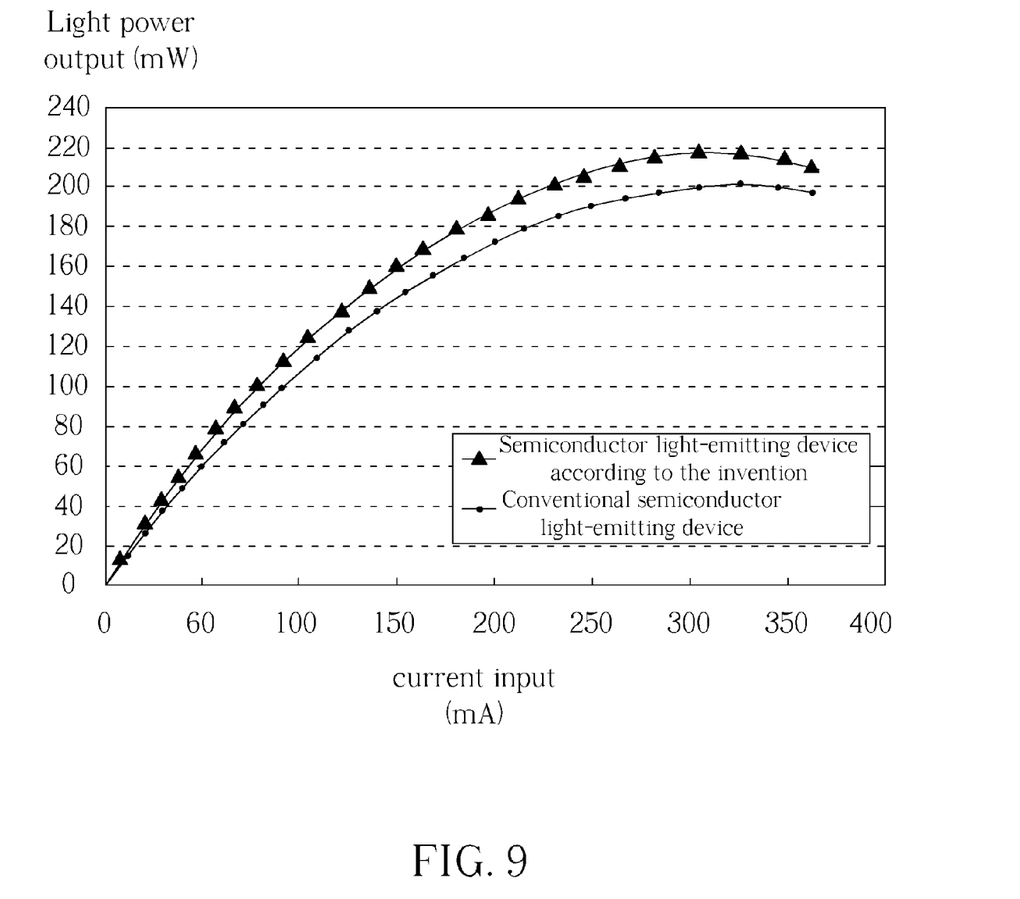
FIG. 9 is a broken line diagram demonstrating a relationship between optical power output and relative current input according to two different semiconductor light-emitting devices.

Please refer to FIG. 8 and FIG. 9. FIG. 8 is a light distribution curve demonstrating the performance of two different semiconductor light-emitting devices; FIG. 9 is a broken line graph demonstrating a relationship between optical power outputs and relative current inputs according to two different semiconductor light-emitting devices. As shown in FIG. 8, in a conventional semiconductor light-emitting device, the highest light intensity is usually at an emission angle of 90° and the light intensity is gradually reduced towards two ends of emission angles (i.e. 0° or 180°). Hence, the light distribution uniformity is poor because the light ray is mainly concentrated at an emission angle of 90°. However, in the semiconductor light-emitting device 10 disclosed in the application, the highest light intensity is usually at emission angles of 60° and 120° and the light intensity is gradually reduced toward a middle and two ends of emission angles (i.e. 0°, 90° or 180°). Hence, the light distribution uniformity is better compared to the conventional light-emitting device described above.

Referring to the data shown in FIG. 9, it is obvious that the optical power output generated from the device disclosed in the present application is larger than that in the conventional device when the current input increased from 0 milliampere (mA) to 350 mA gradually. This is because several reverse tapers (not shown) consisting of the several non-parallel etched surfaces 310 and 320 may shorten the transmitting time of the light ray inside the semiconductor layer (not shown); therefore, the light ray absorption probability inside the semiconductor layer is reduced.

In sum, by providing a patterned substrate 100, a buffer layer 120 composed of aluminum nitride and performing a wet-etching process by orthophosphoric acid, the semiconductor light-emitting device 10 with several non-parallel etched surfaces 310 and 320 is provided, so that part of the light rays may be emitted from the second etched surface 320. For that, light rays are concentrated at an emission angle of 90°. In addition, since there is no total reflection on the second etched surface 320, the transmitting time of the light rays inside the semiconductor layer is shortened; therefore, the light extraction efficiency is also enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor light-emitting device, comprising:
    a substrate comprising a main surface and an exposed surface, wherein the main surface and the exposed surface comprise concavo-convex structures;
    an epitaxial structure disposed on the main surface of the substrate comprising a first type semiconductor layer, a light-emitting layer, a second type semiconductor layer, a buffer layer disposed between the first type semiconductor layer and a nucleation layer and the nucleation layer disposed between the substrate and the buffer layer;
    an electrode structure disposed on the epitaxial structure;
    wherein an upper part of the first type semiconductor layer comprises a first sidewall comprising a first etched surface so that a first angle between the first etched surface and the exposed surface is acute;
    wherein a bottom part of the first type semiconductor layer, the buffer layer, and the nucleation layer comprises a second sidewall comprising a second etched surface so that a second angle between the second etched surface and the exposed surface is also acute which is narrower than the first angle,
    wherein an angle inside the epitaxial structure between the first etched surface and the second etched surface is between 90° and 180°, wherein highest light intensity is usually at emission angles of 60° and 120° and the light intensity is gradually reduced toward emission angles of 0° and 180°.

2. The semiconductor light-emitting device according to claim 1, wherein the buffer layer is a nitride material doped with aluminum.

3. The semiconductor light-emitting device according to claim 1, wherein the first etched surface is not parallel to the second etched surface.

4. The semiconductor light-emitting device according to claim 1, wherein the first etched surface is adjacent to the second etched surface.

* * * * *